United States Patent [19]
Lavan et al.

[11] Patent Number: 5,629,605
[45] Date of Patent: May 13, 1997

[54] PULSEWIDTH MODULATED VISUAL INDICATOR FOR BATTERY STATUS

[75] Inventors: Thomas J. Lavan; Jerry D. Gandre, both of Austin, Tex.

[73] Assignee: Dell USA, L.P., Austin, Tex.

[21] Appl. No.: 378,127

[22] Filed: Jan. 24, 1995

[51] Int. Cl.$^6$ .................. H01M 10/44; H01M 10/46; H01M 10/48

[52] U.S. Cl. .................. 320/43; 320/48; 324/427

[58] Field of Search .................. 320/12, 13, 30, 320/39, 43, 48; 324/427, 432, 433; 340/635, 636; 429/90

[56] References Cited

U.S. PATENT DOCUMENTS

| | | | |
|---|---|---|---|
| 4,595,872 | 6/1986 | Ball | 320/48 X |
| 5,459,671 | 10/1995 | Duley | 320/48 X |

*Primary Examiner*—Edward Tso

[57] ABSTRACT

A battery status indication circuit and a method of indicating battery status. The battery status indication circuit comprises: (1) an indicator having an inactive state and an active state and (2) an indicator modulation circuit adapted to receive a charge level signal indicating a charge level of a battery and transmit, in response thereto, a pulsewidth modulated indicator signal to the indicator, a duty cycle of the indicator signal being a function of the charge level, the indicator thereby toggling between the inactive and active states to provide an indication of the charge level. A single indicator having only two states can therefore be employed to indicate multiple grades of battery charge level.

37 Claims, 2 Drawing Sheets

PULSEWIDTH MODULATED VISUAL INDICATOR FOR BATTERY STATUS

TECHNICAL FIELD OF THE INVENTION

The present invention is directed, in general, to battery monitoring and, more specifically, to a visual indicator that is pulsewidth modulated as a function of battery status to provide a specific indication of the status.

BACKGROUND OF THE INVENTION

Personal computers ("PCs") generally comprise a microprocessor central processing unit ("CPU") and memory and input/output ("I/O") subsystems. The CPU is the PC's processing center of activity, assigned the responsibility of performing basic calculations on data stored in the computer's memory. The memory subsystem provides volatile primary storage space for programs or data to be processed by the CPU. The I/O subsystem provides nonvolatile secondary storage, such as disk storage.

The speed of interaction between the CPU and memory and I/O subsystems significantly governs the speed at which the PC can process and store information. In particular, the shorter the time required for memory access, the faster the CPU can retrieve data to be executed and the faster the CPU can return the processed data to memory.

To achieve faster effective memory access, the prior art has provided the concept of cache memory. A cache memory is a relatively fast memory that resides logically between the CPU and a cached memory. The purpose of cache memory is to increase the effective access speed of the main memory by avoiding the need for some accesses to the main memory. Cache memories operate by providing fast-access storage for a small portion of the data stored in the main memory. If the CPU wishes to read data that happens to be contained in the cache memory, a cache "hit" occurs, avoiding the need to access the main memory. If the cache memory does not happen to contain the data, a cache "miss" occurs, requiring a lengthier access to the main memory. Obviously, selection of the data to store in the cache memory requires intelligent guessing and is the subject of much inventive attention.

Caches are typically small relative to the main memory, because the relatively fast memory that constitutes cache memory is concomitantly relatively expensive. If all memory could be constructed out of the same fast memory used for caches, there would not be a need for a cache. Cache memory is therefore an efficient, cost-effective way of using a small amount of very fast memory to optimize effective memory access speed.

Therefore, on higher performance systems, the memory subsystem is often layered and includes both a main memory and a main memory cache, each of which are coupled through a host bus of the PC. Likewise, on such higher performance systems, the I/O subsystem may also be layered and thus include not only the disk storage, but a disk cache interposed between the disk storage and the CPU. Since the memory subsystem primary memory is directly coupled to the CPU through the host bus, in general, the primary memory realizes a dramatically shorter access time than the secondary memory.

With respect to write accesses, cache memories may operate in either a write-through mode or in a write-back mode. In a write-through mode, memory writes are made concurrently to both the cache memory and the main memory. Write-through caching is regarded as a conservative method of caching, because writes are concurrent and there is no risk that the main memory contains obsolete data. Unfortunately, because writes to the main memory continue as though no cache memory were in place, decreases in effective access time are only realized in reads from the main memory.

In a write-back mode, writes are made only to the cache memory. Periodically, the cache memory is "flushed" to the main memory and obsolete data in the main memory is thus superseded in a batch. Since data is written to the main memory in a "burst" when the cache memory is flushed, bus utilization is more efficient. Therefore a write-back cache is faster than a write-through cache.

However, write-back cacheing is risky; if power to the cache memory is lost while the cache memory contains data as yet unwritten to the main memory, that unwritten data is lost. When power is restored, the main memory contains obsolete data.

On very high performance systems, such as local area network ("LAN") servers, it is most advantageous to operate in a write-back mode. However, the associated risk of data loss is intolerable. Because cost is less a factor in such very high performance systems, the prior art provides battery backup systems to protect the write-back cache memory as against power loss. The battery backup system continues to power the cache memory for a predetermined period of time after a power outage. As a result, the user is assured, for a limited time, that the current data in the write-back cache memory is safe.

Since it is vital that the user know how long the battery backup system will function to protect the user's data, prior art battery backup systems incorporate a visual indicator to instruct the user of the battery charge or life status. For example, some battery backup systems employ an expensive liquid crystal display ("LCD") to inform the user of the status of the battery backup system. Other PCs use a bar or "ladder" light-emitting diode ("LED") display, comprising a plurality of individually-activatable LEDs, to inform the user of the status of the battery backup system. In both of these prior art battery backup systems, the battery status indicators and their associated drive circuitry are relatively complex and expensive.

Accordingly, what is needed in the art is a battery charge or life indicator for cache memory subsystems that is relatively simple and inexpensive in construction without sacrificing the indicator's ability adequately to inform the user of remaining battery charge or life.

SUMMARY OF THE INVENTION

To address the above-discussed deficiencies of the prior art, it is a primary object of the present invention to provide a means by which a single indicator having only two states can be employed to indicate multiple grades of battery charge level.

Accordingly, in the attainment of the above-described primary object, the present invention provides a battery status indication circuit and a method of indicating battery status. The battery status indication circuit comprises: (1) an indicator having an inactive state and an active state and (2) an indicator modulation circuit adapted to receive a charge level signal indicating a charge level of a battery and transmit, in response thereto, a pulsewidth modulated indicator signal to the indicator, a duty cycle of the indicator signal being a function of the charge level, the indicator thereby toggling, at a relative brightness determined by the duty cycle, between the inactive and active states to provide an indication of the charge level.

A single indicator having only two states can therefore be employed to indicate multiple grades of battery charge level. Because the present invention can operate with only a single indicator, the present invention is relatively simple and inexpensive in construction.

In a preferred embodiment of the present invention, the circuit further comprises a storage circuit, coupled to the indicator modulation circuit, for storing a plurality of values relating to the duty cycle, the indicator modulation circuit retrieving selected ones of the values to generate the indicator signal. In the embodiment to be illustrated, the storage circuit stores a lookup table that contains values pertaining to the duty cycle in an orderly fashion. Based on charge level, the values are retrieved and the duty cycle determined.

In a preferred embodiment of the present invention, the indicator is a visual indicator. In a more preferred embodiment, the visual indicator is an LED. Thus, a relatively inexpensive LED may be used in lieu of more expensive multiple segment bar graph or ladder displays or LCD displays. Of course, it is within the scope of the present invention to include non-visual indicators, such as audible alarms or the like to provide non-visual information to the user.

In a preferred embodiment of the present invention, the circuit further comprises a battery charge level detection circuit adapted to sense the charge level of the battery and transmit the charge level signal to the indicator modulation circuit. Thus, the present invention provides a circuit to sense battery charge level. The present invention can also operate in conjunction with a circuit that derives charge level by some other means, perhaps employing stored charge level curves based on experience with such batteries and associated loads.

In a preferred embodiment of the present invention, the circuit further comprises a battery drain detection circuit adapted to sense drain of the battery and transmit a drain signal to the indicator modulation circuit. Therefore, the present invention preferably provides a circuit to sense battery drain. The present invention can also operate in conjunction with a circuit that derives drain rate by some other means, perhaps employing stored drain rate curves based on experience with such batteries and associated loads.

In a preferred embodiment of the present invention, the battery is a rechargeable nickel metal hydride ("NiMH") battery. Such batteries are well known and commercially available. They are commonly used to provide high quality power to portable computer systems. Because they are rechargeable, they may be automatically maintained at a peak charge by known battery maintenance circuitry, such that they are available when needed.

In a preferred embodiment of the present invention, the battery provides power to a cache memory subsystem. As previously described, cache memories are particularly vulnerable to data loss when operating in a write-back mode. Thus, the present invention provides an indicator circuit for a battery backup power source for such subsystem. The indicator gives the user clear information regarding the remaining life of the battery, and, hence, the cache memory subsystem and the volatile data stored therein.

Those of skill in the art will find uses for the present invention outside battery backup power sources for cache memory subsystems, however. Any application involving limited-life battery backup can benefit from the simplicity and economy of the present invention, for instance, portable computer systems (PCs, in particular) and other battery-powered data equipment.

In a preferred embodiment of the present invention, the indicator modulation circuit comprises a counter circuit adapted to measure a period of time and thereby determine the duty cycle. Thus, the indicator modulation circuit preferably employs one or more counters to determine when the indicator signal is deasserted and asserted. When coupled with the lookup table embodiment described above, the values stored in the lookup table may be retrieved therefrom and loaded into the counter or counters as initial values. The counters then count at a predetermined rate to measure the period(s) of time.

The foregoing has outlined rather broadly the features and technical advantages of the present invention so that the detailed description of the invention that follows may be better understood. Additional features and advantages of the invention will be described hereinafter which form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention as broadly defined.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
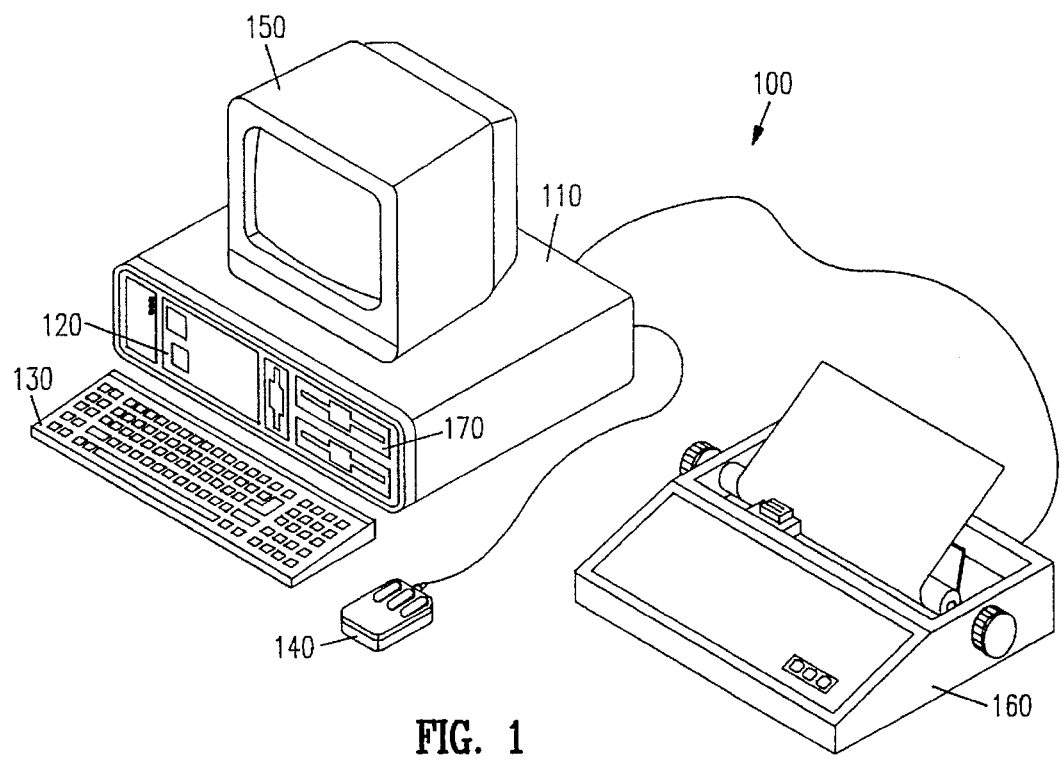
FIG. 1 illustrates an isometric view of a PC providing an environment within which the present invention may operate.

Referring initially to FIG. 1, illustrated is an isometric view of a PC 100 that provides an environment within which the present invention may operate. Since the present invention is not limited to application in a PC environment, however, FIG. 1 is illustrative only. The PC 100 includes a main chassis 110, a dedicated hardware reset switch 120, a keyboard 130, a mouse 140, a monitor or display device 150, a printer 160 and a disk drive 170 employed as a nonvolatile secondary storage device. The main chassis 110 houses various electronic components of the PC 100 (to be illustrated in FIG. 2).

The display device 150 and the keyboard 130 cooperate to allow communication between the PC 100 and a user. The mouse 140 provides a means by which the user can point to data displayed on the display device 150 to take action with respect thereto.

The dedicated hardware reset switch 120 is adapted to trigger hardware reset circuitry (not shown) within the main chassis 110 to "reboot" or restart the PC 100 when the user depresses the reset switch 120. The main chassis 110 further includes a power switch (not shown) capable of interrupting power from a main electrical power source (not shown in FIG. 1) to the PC 100. Interruption and restoration of power also brings about a restart of the PC 100.

Figure 2:
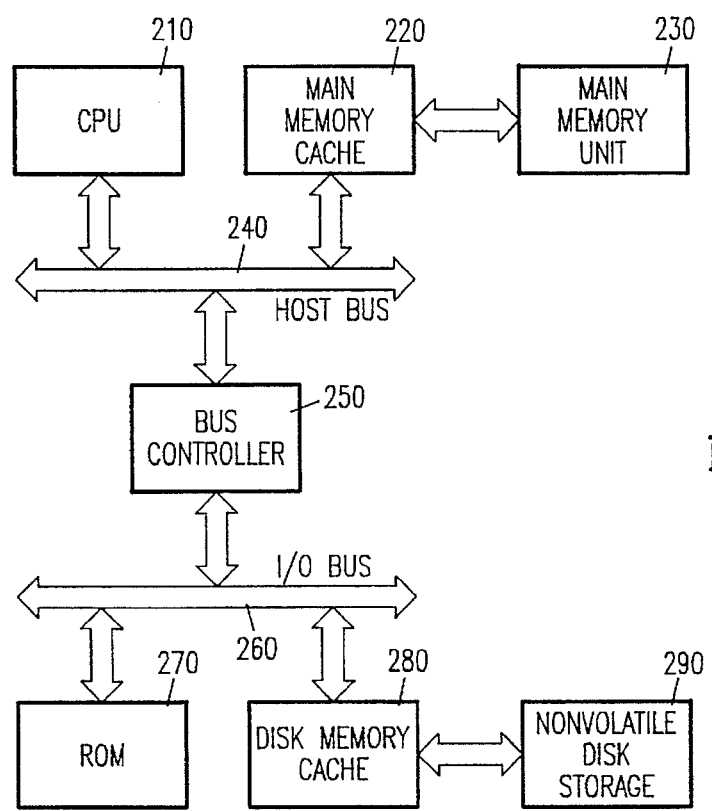
FIG. 2 illustrates a block diagram of the PC of FIG. 1.

Turning now to FIG. 2, illustrated is a block diagram of the PC 100 of FIG. 1. In a preferred embodiment, a CPU 210 is coupled to a bus controller 250 via a host bus 240. A main memory cache 220 comprising relatively fast DRAM is coupled between the host bus 240 and a slower DRAM main memory 230. The main memory cache 220 serves as a temporary repository for data communicated between the main memory 230 and the CPU 210. Since the main memory cache 220 is fast, the communication of data between the main memory 230 and the CPU 210 is speeded. The host bus 240 is capable of transmitting address and data signals at a relatively high speed between the CPU 210, the main memory cache 220 and the bus controller 250.

The bus controller 250 is also attached to an expansion or I/O bus 260. The I/O bus 260, in contrast to the host bus 240, is only capable of transmitting address and data signals at relatively low speeds. Also attached to the I/O bus 260 are a basic I/O system read-only memory ("BIOS ROM") 270 and a series of extended industry-standard architecture ("EISA") slots adapted to receive EISA daughter cards therein. The BIOS ROM 270 is comprised of several individual ROM chips coupled together to provide permanent storage for the computer system's power-on-self-test ("POST") and BIOS instructions. One of the EISA slots contains a disk memory cache 280 coupled between the I/O bus 260 and nonvolatile disk storage 290, such as the disk drive 170 of FIG. 1. The addition of the disk memory cache 280 to the I/O bus 260 provides speeded memory for the nonvolatile disk storage 290.

As can be seen in FIG. 2, the bus controller 250 is coupled between the host bus 240 and the I/O bus 260. The bus controller 250 is responsible for managing all communication of address and data signals between the host bus 240 and the I/O bus 260.

In the illustrated embodiment, a battery 310 (as illustrated and described in conjunction with FIG. 3) provides power to the cache memory subsystems 220, 280. As previously described, cache memories are particularly vulnerable to data loss when operating in a write-back mode. Thus, the present invention provides a battery status indicator circuit 300 (shown in FIG. 3) for a battery backup power source for such subsystems. An indicator (not shown) gives the user clear information regarding the remaining life of the battery 310, and, hence, the cache memory subsystems 220, 280 and the volatile data stored therein.

Figure 3:
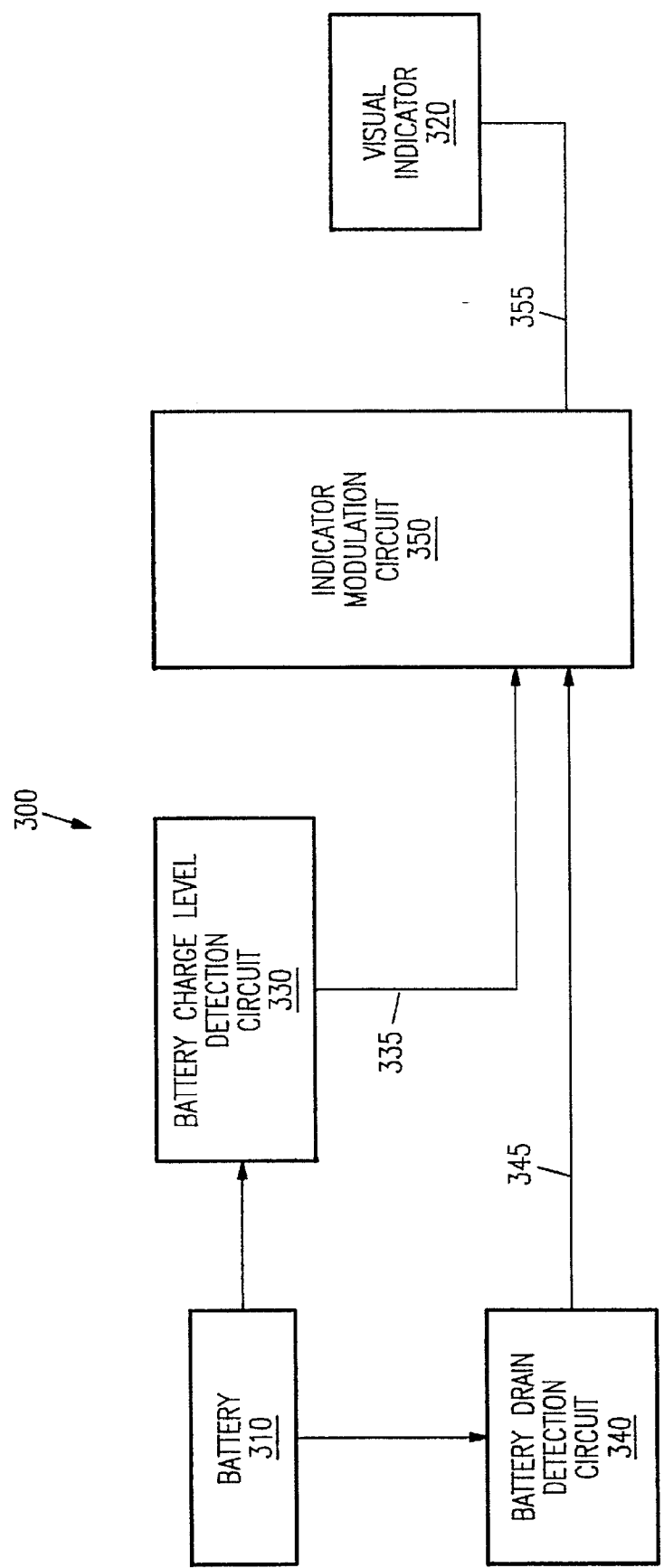
FIG. 3 illustrates a block diagram of the battery status indication circuit of the present invention.

Turning now to FIG. 3, illustrated is a block diagram of the battery status indication circuit 300 of the present invention. Again, the present invention provides a battery status indication circuit 300 and a method of indicating status of the battery 310. The battery status indication circuit 300 comprises a visual indicator 320 having an inactive state and an active state. A battery charge level detection circuit 330 is adapted to sense a charge level of a battery 310 coupled thereto and transmit a charge level signal 335 indicating a value that is a function of the charge level.

A battery drain detection circuit 340, coupled to the battery 310, is adapted to sense drain of the battery 310 and transmit a drain signal 345 indicating that the battery is being drained. The battery drain detection circuit 340 comprises a battery drain sensor that is typically a well known, commercially available current sensor. An indicator modulation circuit 350 is adapted to receive the charge level signal 335 and the drain signal 345 from the battery charge level detection circuit 330 and the battery drain detection circuit 340, respectively. In response thereto, the indicator modulation circuit 350 transmits a pulsewidth modulated indicator signal 355 to the visual indicator 320.

The indicator signal 355 has a duty cycle that is a function of the charge level of the battery 310. The indicator signal 355 causes the indicator 320 to toggle between the inactive and active states to provide an indication of remaining life of the battery 310. There are two ways to indicate the status of the battery 310. First, the frequency may be set at a high value (e.g. 1000 Hz.) and the duty cycle may be varied to vary the intensity of the visual indicator 320, in the manner of a dimmer. Conversely, the frequency may be varied across a low frequency range (e.g. 0.1–3 Hz.) with a constant duty cycle (50/50, for example) to vary the blink rate of the visual indicator 320.

The indicator circuit 300 further comprises a storage circuit (not shown), coupled to the indicator modulation circuit 350, for storing a plurality of values relating to the duty cycle or frequency, depending on which of the two methods discussed above are used to indicate the status of the battery. The indicator modulation circuit 350 retrieves selected values to generate the indicator signal 355. More specifically, the storage circuit stores a lookup table that contains values pertaining to the duty cycle or frequency. Based on charge level, the values are retrieved and the duty cycle or frequency is determined.

The indicator modulation circuit 350 is illustrated as comprising a counter circuit (not shown) adapted to measure a period of time and thereby determine the duty cycle or frequency. Thus, the indicator modulation circuit 350 preferably employs one or more counters to determine when the indicator signal 355 is deasserted and asserted. The values stored in the lookup table are retrieved therefrom and loaded into the counter or counters as initial values. The counters then count at a predetermined rate to measure the period(s) of time. For example, one counter is loaded with a "high" time and the other counter with a corresponding "low" time from the lookup table. Thus, any one value from the battery status indication circuit 300 corresponds to a pair of values in the lookup table. Thus, the operation of the counters depends upon the values selected from the lookup table corresponding to the status of the battery 310.

In the illustrated embodiment, the visual indicator 320 is preferably an LED, and the LED preferably blinks slower as the lifetime of the battery 310 shrinks. Thus, a relatively inexpensive LED may be used in lieu of more expensive multiple segment bar or ladder displays or LCD displays. Of course, it is within the scope of the present invention to include non-visual indicators, such as audible alarms or the like to provide non-visual information to the user.

The battery 310 is preferably a rechargeable nickel metal hydride (NiMH) battery. Such batteries are well known and commercially available. They are commonly used to provide high quality power to portable computer systems. Because they are rechargeable, they may be automatically maintained at a peak charge by known battery maintenance circuitry, such that they are available when needed.

From the above description, it is apparent that the present invention provides a battery status indication circuit and a method of indicating battery status. The battery status indication circuit comprises: (1) an indicator having an inactive state and an active state and (2) an indicator modulation circuit adapted to receive a charge level signal indicating a charge level of a battery and transmit, in response thereto, a pulsewidth modulated indicator signal to the indicator, a duty cycle or frequency of the indicator signal being a function of the charge level, the indicator thereby toggling between the inactive and active states to provide an indication of the charge level.

It is contemplated by the inventor that some users may wish to have a reference point for the indicator 320 which allows a user to view what the indicator 320 would look like in the event that the battery 310 were fully charged. This reference point would allow the user to compare the current battery charge level, as shown by the indicator, with that of a fully charged battery. Such a ratio comparison would readily communicate to the user a more accurate relative state of battery charge level. In such an instance, and in view of the embodiments discussed above, an additional function would be included within the indicator modulation circuit 350 which provides either a high duty cycle, or a high frequency signal to the visual indicator 320. For example, a switch circuit (not shown) would toggle signal line 355 between a constant high duty cycle (or high frequency) signal, and the signal 355 proportional to the charge level of the battery 310. Such switch circuit could toggle between these two signals at some predetermined time period, say every 5 seconds, or could switch to the reference point signal just briefly at some predetermined, but repetitive time.

Although the present invention and its advantages have been described in detail, it should be understood that various changes, substitutions and alterations can be made herein without departing from the spirit and scope of the invention as broadly defined.

What is claimed is:

1. A battery status indication circuit, comprising:
    an indicator having an inactive state and an active state; and
    an indicator modulation circuit adapted to receive a charge level signal indicating a charge level of a battery and transmit, in response thereto, a pulsewidth modulated indicator signal to said indicator, a duty cycle of said indicator signal being a function of said charge level, said indicator thereby toggling, at a frequency determined by said duty cycle, between said inactive and active states to provide an indication of said charge level; and,
    a storage circuit, coupled to said indicator modulation circuit, for storing a plurality of values relating to said duty cycle, said indicator modulation circuit retrieving selected ones of said values to generate said indicator signal.

2. The circuit as recited in claim 1 wherein said indicator modulation circuit is further adapted to receive a drain signal indicating that said battery is being drained and transmit, in response thereto, said indicator signal to said indicator, said duty cycle being a function of said charge level, said indicator thereby toggling to provide an indication of remaining battery life.

3. The circuit as recited in claim 1 wherein said indicator is a visual indicator.

4. The circuit as recited in claim 3 wherein said visual indicator is a light emitting diode (LED).

5. The circuit as recited in claim 1 further comprising a battery charge level detection circuit adapted to sense said charge level of said battery and transmit said charge level signal to said indicator modulation circuit.

6. The circuit as recited in claim 1 further comprising a battery drain detection circuit adapted to sense a drain of said battery and transmit a drain signal to said indicator modulation circuit.

7. The circuit as recited in claim 1 wherein said battery is a rechargeable nickel metal hydride (NiMH) battery.

8. The circuit as recited in claim 1 wherein said battery provides power to a cache memory subsystem.

9. A battery status indication circuit, comprising:
    an indicator having an inactive state and an active state; and
    an indicator modulation circuit adapted to receive a charge level signal indicating a charge level of a battery and transmit, in response thereto, a pulsewidth modulated indicator signal to said indicator, a duty cycle of said indicator signal being a function of said charge level, said indicator thereby toggling, at a frequency determined by said duty cycle, between said inactive and active states to provide an indication of said charge level, the indicator modulation circuit including a counter circuit adapted to measure a period of time and thereby determine said duty cycle.

10. A method of indicating battery status, comprising the steps of:
    receiving a charge level signal indicating a charge level of a battery into an indicator modulation circuit;
    transmitting, in response to said receiving, a pulsewidth modulated indicator signal to an indicator having an inactive state and an active state, a duty cycle of said indicator signal being a function of said charge level, said indicator thereby toggling, at a frequency determined by said duty cycle, between said inactive and active states to provide an indication of said charge level; and,
    storing a plurality of values relating to said duty cycle, said indicator modulation circuit retrieving selected ones of said values to generate said indicator signal.

11. The method as recited in claim 10 further comprising the step of receiving a drain signal indicating that said battery is being drained into said indicator modulation circuit, said indicator modulation circuit transmitting, in response thereto, said indicator signal to said indicator, said duty cycle being a function of said charge level, said indicator thereby toggling to provide an indication of remaining battery life.

12. The method as recited in claim 10 wherein said indicator is a visual indicator.

13. The circuit as recited in claim 12 wherein said visual indicator is a light emitting diode (LED).

14. The method as recited in claim 10 further comprising the step of sensing said charge level of said battery with a battery charge level detection circuit, said battery charge level circuit transmitting said charge level signal to said indicator modulation circuit.

15. The method as recited in claim 10 further comprising the step of sensing a drain of said battery with a battery drain detection circuit, said battery drain detection circuit transmitting a drain signal to said indicator modulation circuit.

16. The method as recited in claim 10 wherein said battery is a rechargeable nickel metal hydride (NiMH) battery.

17. The method as recited in claim 10 further comprising the step of providing power from said battery to a cache memory subsystem.

18. A method of indicating battery status, comprising the steps of:
    receiving a charge level signal indicating a charge level of a battery into an indicator modulation circuit;
    transmitting, in response to said receiving, a pulsewidth modulated indicator signal to an indicator having an inactive state and an active state, a duty cycle of said indicator signal being a function of said charge level, said indicator thereby toggling, at a frequency determined by said duty cycle, between said inactive and active states to provide an indication of said charge level; and,
    measuring a period of time with a counter circuit in said indicator modulation circuit, said counter circuit thereby determining said duty cycle.

19. A battery status indication circuit, comprising:

a visual indicator having an inactive state and an active state;

a battery charge level detection circuit adapted to sense a charge level of a battery coupled thereto and transmit a charge level signal indicating a value that is a function of said charge level;

a battery drain detection circuit, coupled to said battery, adapted to sense a drain rate of said battery and transmit a drain rate signal indicating a value that is a function of said drain rate; and an indicator modulation circuit adapted to receive said charge level signal and said drain rate signal from said battery charge level detection circuit and said battery drain detection circuit, respectively, said indicator modulation circuit transmitting, in response thereto, a pulsewidth modulated indicator signal to said visual indicator, a duty cycle of said indicator signal being a function of said charge level and said drain rate, said indicator thereby toggling, at a frequency determined by said duty cycle, between said inactive and active states to provide an indication of remaining battery life; and, a storage circuit, coupled to said indicator modulation circuit, for storing a plurality of values relating to said duty cycle, said indicator modulation circuit retrieving selected ones of said values to generate said indicator signal.

20. The circuit as recited in claim 19 wherein said visual indicator is a light emitting diode (LED).

21. The circuit as recited in claim 19 wherein said battery is a rechargeable nickel metal hydride (NiMH) battery.

22. The circuit as recited in claim 19 wherein said battery provides power to a cache memory subsystem.

23. A battery status indication circuit, comprising:

a visual indicator having an inactive state and an active state;

a battery charge level detection circuit adapted to sense a charge level of a battery coupled thereto and transmit a charge level signal indicating a value that is a function of said charge level;

a battery drain detection circuit, coupled to said battery, adapted to sense a drain rate of said battery and transmit a drain rate signal indicating a value that is a function of said drain rate; and an indicator modulation circuit adapted to receive said charge level signal and said drain rate signal from said battery charge level detection circuit and said battery drain detection circuit, respectively, said indicator modulation circuit transmitting, in response thereto, a pulsewidth modulated indicator signal to said visual indicator, a duty cycle of said indicator signal being a function of said charge level and said drain rate, said indicator thereby toggling, at a frequency determined by said duty cycle, between said inactive and active states to provide an indication of remaining battery life, the indicator modulation circuit including a counter circuit adapted to measure a period of time and thereby determine said duty cycle.

24. A method of indicating battery status, comprising the steps of:

sensing a charge level of a battery coupled to a battery charge level detection circuit, said battery charge level detection circuit transmitting a charge level signal indicating a value that is a function of said charge level;

sensing a drain rate of said battery with a battery drain detection circuit coupled to said battery, said battery drain detection circuit transmitting a drain rate signal indicating a value that is a function of said drain rate; and receiving said charge level signal and said drain rate signal from said battery charge level detection circuit and said battery drain detection circuit, respectively, into an indicator modulation circuit, said indicator modulation circuit transmitting, in response thereto, a pulsewidth modulated indicator signal to a visual indicator having an inactive state and an active state, a duty cycle of said indicator signal being a function of said charge level and said drain rate, said indicator thereby toggling, at a frequency determined by said duty cycle, between said inactive and active states to provide an indication of remaining battery life; and storing a plurality of values relating to said duty cycle, said indicator modulation circuit retrieving selected ones of said values to generate said indicator signal.

25. The method as recited in claim 24 wherein said visual indicator is a light emitting diode (LED).

26. The method as recited in claim 24 wherein said battery is a rechargeable nickel metal hydride (NiMH) battery.

27. The method as recited in claim 24 further comprising the step of providing power from said battery to a cache memory subsystem.

28. A method of indicating battery status, comprising the steps of:

sensing a charge level of a battery coupled to a battery charge level detection circuit, said battery charge level detection circuit transmitting a charge level signal indicating a value that is a function of said charge level;

sensing a drain rate of said battery with a battery drain detection circuit coupled to said battery, said battery drain detection circuit transmitting a drain rate signal indicating a value that is a function of said drain rate; and receiving said charge level signal and said drain rate signal from said battery charge level detection circuit and said battery drain detection circuit, respectively, into an indicator modulation circuit, said indicator modulation circuit transmitting, in response thereto, a pulsewidth modulated indicator signal to a visual indicator having an inactive state and an active state, a duty cycle of said indicator signal being a function of said charge level and said drain rate, said indicator thereby toggling, at a frequency determined by said duty cycle, between said inactive and active states to provide an indication of remaining battery life; and measuring a period of time with a counter circuit in said indicator modulation circuit, said counter circuit thereby determining said duty cycle.

29. A computer system comprising:

a processor;

a cache memory coupled to the processor;

a battery coupled to the cache memory, the battery providing power to the cache memory;

a battery status indication circuit, the battery status indication circuit including an indicator having an inactive state and an active state; and an indicator modulation circuit adapted to receive a charge level signal indicating a charge level of the battery and transmit, in response thereto, a pulsewidth modulated indicator signal to said indicator, a duty cycle of said indicator signal being a function of said charge level, said indicator thereby toggling, at a frequency determined by said duty cycle, between said inactive and active states to provide an indication of said charge level, and a storage circuit, coupled to said indicator modulation circuit, for storing a plurality of values relating to said duty cycle, said indicator modulation circuit retrieving selected ones of said values to generate said indicator signal.

30. The circuit as recited in claim 29 wherein said indicator modulation circuit is further adapted to receive a drain rate signal indicating a rate at which said battery is being drained and transmit, in response thereto, said indicator signal to said indicator, said duty cycle being a function of both said charge level and said drain rate, said indicator thereby toggling to provide an indication of remaining battery life.

31. The circuit as recited in claim 29 further comprising a storage circuit, coupled to said indicator modulation circuit, for storing a plurality of values relating to said duty cycle, said indicator modulation circuit retrieving selected ones of said values to generate said indicator signal.

32. The circuit as recited in claim 29 wherein said indicator is a visual indicator.

33. The circuit as recited in claim 29 further comprising a battery charge level detection circuit adapted to sense said charge level of said battery and transmit said charge level signal to said indicator modulation circuit.

34. The circuit as recited in claim 29 further comprising a battery drain detection circuit adapted to sense a drain rate of said battery and transmit a drain rate signal to said indicator modulation circuit.

35. The circuit as recited in claim 29 wherein said battery is a rechargeable nickel metal hydride (NiMH) battery.

36. The circuit as recited in claim 29 wherein said battery provides power to a cache memory subsystem.

37. The circuit as recited in claim 29 wherein said indicator modulation circuit comprises a counter circuit adapted to measure a period of time and thereby determine said duty cycle.

\* \* \* \* \*